United States Patent
Nagahori

(10) Patent No.: US 6,903,580 B2
(45) Date of Patent: Jun. 7, 2005

(54) OPTICAL TRANSMITTING CIRCUIT

(75) Inventor: Takeshi Nagahori, Tokyo (JP)

(73) Assignee: NEC Corporation, Tokyo (JP)

(*) Notice: Subject to any disclaimer, the term of this patent is extended or adjusted under 35 U.S.C. 154(b) by 875 days.

(21) Appl. No.: 09/906,819

(22) Filed: Jul. 18, 2001

(65) Prior Publication Data

US 2002/0011879 A1 Jan. 31, 2002

(30) Foreign Application Priority Data

Jul. 26, 2000 (JP) ........................................ 2000-224744

(51) Int. Cl.[7] .......................... H03K 3/00; H03K 17/687
(52) U.S. Cl. ........................................ 327/108; 327/434
(58) Field of Search .................. 370/108, 434, 370/432; 326/136; 323/312

(56) References Cited

U.S. PATENT DOCUMENTS 6,037,832 A * 3/2000 Kaminishi ................... 327/538
2001/0043093 A1 * 11/2001 Sakura et al. ............... 327/108

FOREIGN PATENT DOCUMENTS

| JP | 3-135123 | 6/1991 |
| JP | 2910279 | 4/1999 |
| JP | 2910280 | 4/1999 |

\* cited by examiner

*Primary Examiner*—Duc Ho
(74) *Attorney, Agent, or Firm*—McGinn & Gibb, PLLC

(57) ABSTRACT

An optical transmitting circuit is provided with a switching circuit including a first current path and a second current path, supplying constant current from an anode electrode to a cathode electrode of an emitting device through M1 and M4 in a first current path in response to a emission drive signal, supplying the constant current from the cathode electrode to the anode electrode through M2 and M3 in a second current path in response to a non-emission drive signal, and supplying bias for the emitting device from a constant current source. By this means, in the case where the emitting device is in an emission state, the sum of the bias current and the constant current via the first current path passes through the emitting device. On the other hand, in the case where the emitting device is in a non-emission state, the difference between the constant current via the second current path and the bias current passes through the emitting device. Therefore the current from the constant current source in the switching circuit may be reduced to less than that in the conventional current switch circuit. Thus it is made possible to provide an optical transmitting circuit with low electric power consumption and low crosstalk from a transmitter to a receiver in transmitter and receiver duplex modular construction.

20 Claims, 4 Drawing Sheets

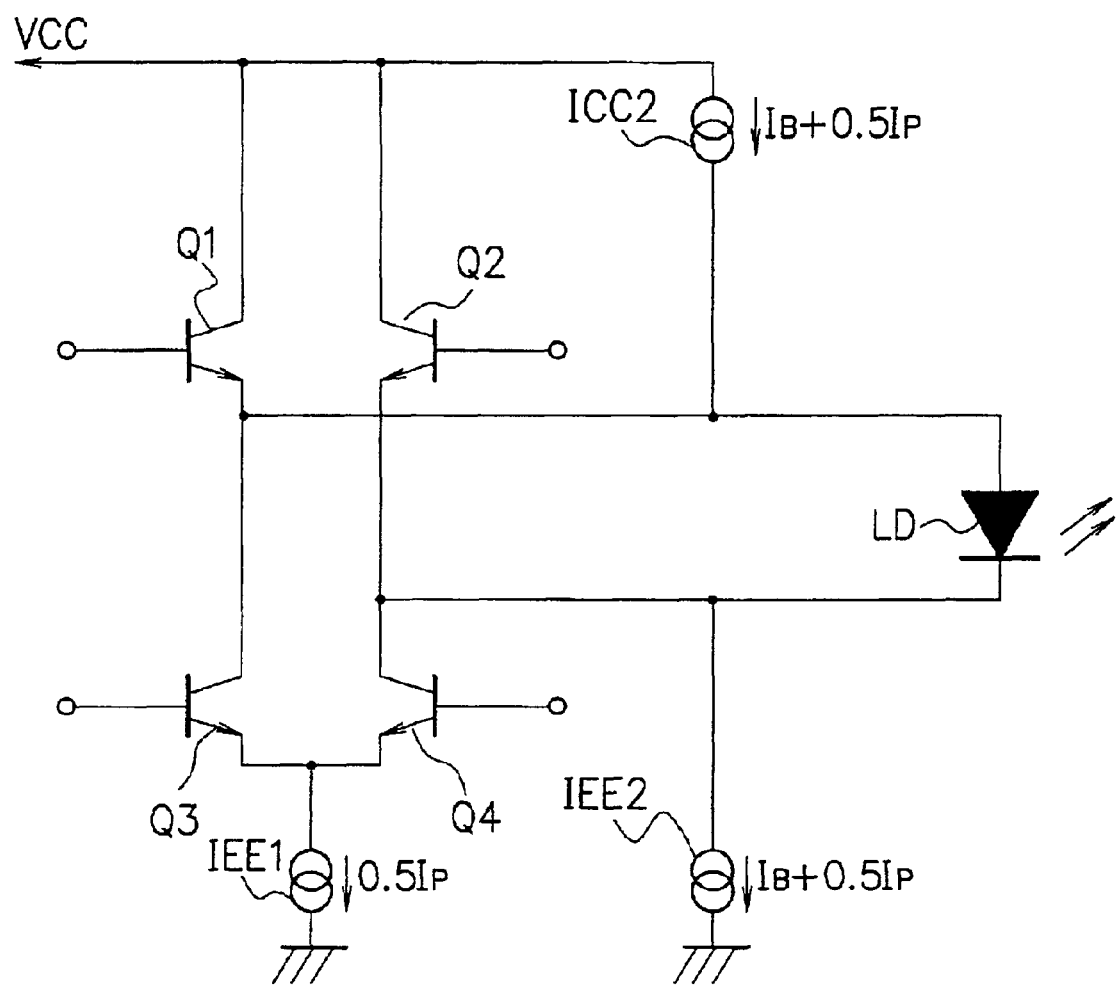
F I G. 5

OPTICAL TRANSMITTING CIRCUIT

BACKGROUND OF THE INVENTION

The present invention relates to an optical transmitting circuit, and in particular, to an optical transmitting circuit suitable for a high-speed and miniature optical transmitter and receiver module(s) that are indispensable for 10 giga bit Ethernet, parallel optical links and so forth.

DESCRIPTION OF THE RELATED ART

In an optical transmitter module(s) for optical fiber communications, it is known that bias current IB is set to in the vicinity of an oscillation threshold value Ith of a semiconductor laser element (LD: laser diode) as shown in FIG. 1, employing the bias current IB as drive current of the LD in a non-emission state and a value of the bias current plus pulse current ($I_B+I_P$) as drive current of the LD in an emission state.

In a high-speed optical transmitting circuit of about 10 Gb/s (giga bit/sec.), load resistance R2 in a current switch which has FET (Field Effect Transistor) M5 and M6 is equalized to characteristic impedance in a transmission line between a drive circuit and an LD as shown in FIG. 2. That is, in FIG. 2, the circuit operates as a current switching circuit for alternately switching current of a constant current source IEE 1 by complementarily supplying a drive signal to each gate of the N-channel transistors M5 and M6, and the LD parallel-connected to the load resistance R2 which is drain load of the transistor M6 is drive-controlled. Incidentally, resistance R1 is drain load resistance of the transistor M5, and a constant current source IEE 2 is bias current source of the LD.

Besides, in the case where a distance between this drive circuit and the LD is short or the acting speed is not so high-speed, the circuitry is designed disregarding impedance matching. For example, the circuitry without respective load resistance R1 and R2 of the transistors M5 and M6 is also adopted as shown in FIG. 3.

Examples of the circuits shown in FIGS. 2 and 3 are disclosed in Japanese Patent Application Laid-Open No. HEI 3-135123, Japanese Patent No.2910279, Japanese Patent No.2910280 and so forth.

However, in the conventional circuitry, there has been a problem of high electric power consumption. That is, in the circuitry as shown in FIG. 2, the bias current source IEE 2 is indispensable in order to supply bias current $I_B$ to the LD. Besides, the constant current source IEE 1 is indispensable in order to supply desirable pulse current $I_P$ to the LD and supply current which is consumed by the load resistance R2.

As an example of a concrete numeric value, in the case where R2 is 25Ω and a voltage between terminals of the LD is 1.2V when $I_P$ is 30 mA, current passing through the resistance R2 becomes 48 mA. In the case of PCM (pulse code modulation) transmission, a time-average value of pulse current $I_P$ passing through the LD is 15 mA because of encoding into marking rate ½. However, in this example of the numeric value, 78 mA current is supplied to the constant current source IEE 1 in order to gain pulse current $I_P$ with the time-average value 15 mA, so that only 19.2% of the circuit current is supplied to the LD, so that electric power consumption gets high.

An optical transmitter module such as an Ethernet is realized as an duplex-type transceiver module(s) by being unified with a receiver, in which there is a technical problem to check crosstalk from a transmitter to a receiver in order to be unified with a receiver. The quantity of crosstalk from a transmitter to a receiver is in proportion to a current value of the constant current source IEE 1. Therefore, in the circuit of FIG. 2, the current value passing through the constant current source IEE 1 is remarkably large in comparison with the pulse current passing through the LD, so that growth of crosstalk occurs.

In circuit structure of FIG. 3, the current value of the constant current source IEE 1 is equal to the pulse current $I_P$ passing through the LD for lack of load resistance R2. Therefore, 50% of the circuit current is supplied with the LD in terms of time-average value of marking rate ½ hour. Although less in degree in comparison with the structure of FIG. 2, the electric current consumption is still high and also crosstalk to receiver is generated. Besides, the circuit is not fit for a high-speed operation because impedance of circuit output and a line between the circuit output and the LD cannot be matched.

SUMMARY OF THE INVENTION

It is therefore a first object of the present invention to provide a high-speed transmitting circuit for optical fiber communications which requires less power.

A second object of the present invention is to reduce crosstalk from a high-speed transmitting circuit to a receiver in a duplex-type transceiver module(s) for optical fiber communications.

According to a first aspect of the present invention, there is provided an optical transmitting circuit comprising;

an emitting device having each electrode of an anode and a cathode; and a switching means for supplying drive current to the emitting device, in which a positive phase output terminal is connected to the anode electrode and a negative phase output terminal is connected to the cathode electrode, wherein:

the switching means includes a first current path for supplying constant current from the anode electrode to the cathode electrode in response to an emission drive signal which makes the emitting device in an emission state, and a second current path for supplying the constant current from the cathode electrode to the anode electrode in response to a non-emission drive signal which makes the emitting device in a non-emission state.

According to a second aspect of the present invention, the optical transmitting circuit further comprises a bias means for supplying bias current to the emitting device, wherein:

output impedance of the positive phase and the negative phase output terminals is set up to equal to characteristic impedance of a transmission line between the switching means and the emitting device; and the bias means includes a first constant current source which is connected to a node between a positive power supply and the positive phase output terminal, and a second constant current source which is connected to a node between a negative power supply and the negative phase output terminal.

According to a third aspect of the present invention, the switching means also includes a third constant current source which is connected to the positive power supply side and produces the constant current, and a fourth constant current source which is connected to the negative power supply side and produces the constant current, wherein:

the first current path includes a first transistor of a first conductive type which is connected to a node between the third constant current source and the positive phase output terminal and on-controlled by the emission drive signal, and a second transistor of a second conductive type which is connected to a node between the fourth constant current source and the negative phase output terminal and on-controlled by the emission drive signal;

the second current path includes a third transistor of the first conductive type which is connected to a node between the third constant current source and the negative phase output terminal and on-controlled by the non-emission drive signal, and a fourth transistor of the second conductive type which is connected to a node between the fourth constant current source and the positive phase output terminal and on-controlled by the non-emission drive signal; and the first to fourth transistors are electric field effect transistors in which the first conductive type is P-channel and the second conductive type is N-channel, or bipolar transistors in which the first conductive type is PNP type and the second conductive type is NPN type.

According to a fourth aspect of the present invention, the switching means also includes a third constant current source which is connected to the negative power supply side and produces the constant current, wherein:

the first current path includes a first transistor which is connected to a node between the positive power supply side and the positive phase output terminal and on-controlled by the emission drive signal, and a second transistor which is connected to a node between the third constant current source and the negative phase output terminal and on-controlled by the emission drive signal;

the second current path includes a third transistor which is connected between the positive power supply and the negative phase output terminal and on-controlled by the non-emission drive signal, and a fourth transistor which is connected to a node between the third constant transistor and the positive phase output terminal and on-controlled by the non-emission drive signal; and the first to fourth transistors are bipolar transistors or electric field effect transistors.

The following is operation. According to the present invention, the optical transmitting circuit is equipped with a switching circuit comprising a first current path and a second current path which are controlled by an emission drive signal and a non-emission drive signal, and includes steps of supplying constant current from an anode electrode to a cathode electrode of an emitting device via the first current path in response to the emission drive signal; supplying the constant current from the cathode electrode to the anode electrode via the second current path in response to the non-emission drive signal; and supplying bias current against the emitting device from a current generator.

By this means, when the emitting device is emitting light, the sum of current of the bias current and the constant current via the first current path passes through the emitting device. On the other hand, when the emitting device is not emitting light, the difference between the constant current source via the second current path and the bias current passes through the emitting device. Therefore, the constant current value of the constant current source in the switching circuit can be made smaller than the current value of the constant current source in the conventional current switch circuit, and thus it is made possible to reduce electric power consumption and crosstalk to an optical receiver.

BRIEF DESCRIPTION OF THE DRAWINGS

The objects and features of the present invention will become more apparent from the consideration of the following detailed description taken in conjunction with the accompanying drawings in which:

FIG. 5 is a circuit diagram showing a second embodiment of the present invention.

DESCRIPTION OF THE PREFERRED EMBODIMENTS

Figure 1:
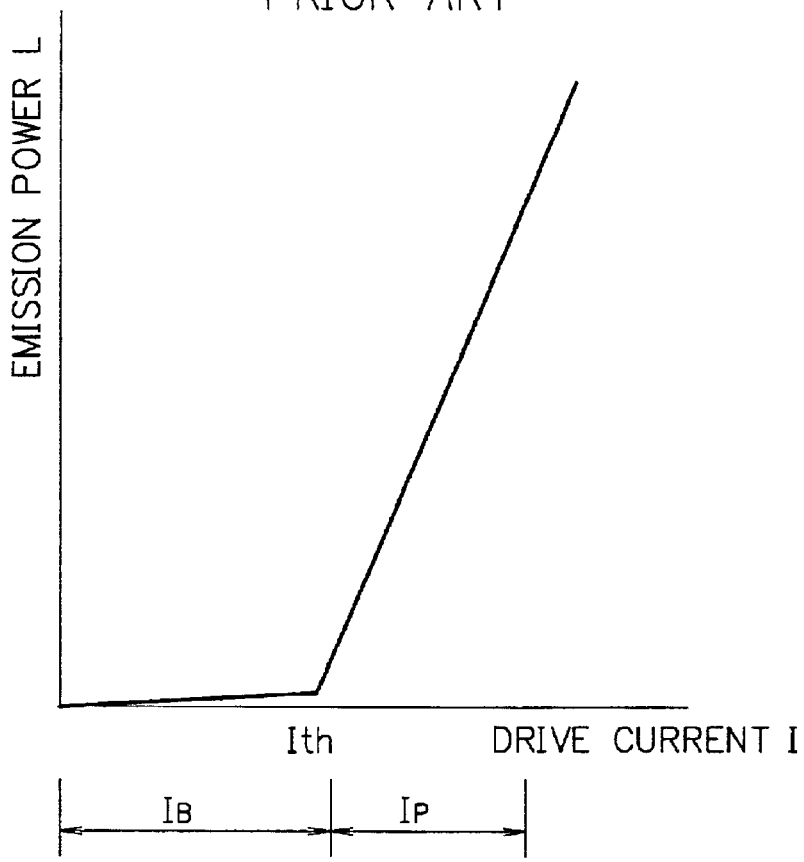
FIG. 1 is an explanation drawing showing a setting method for drive current of a laser diode.

Referring now to the drawings, embodiments of the present invention will be explained in detail.

Figure 4:
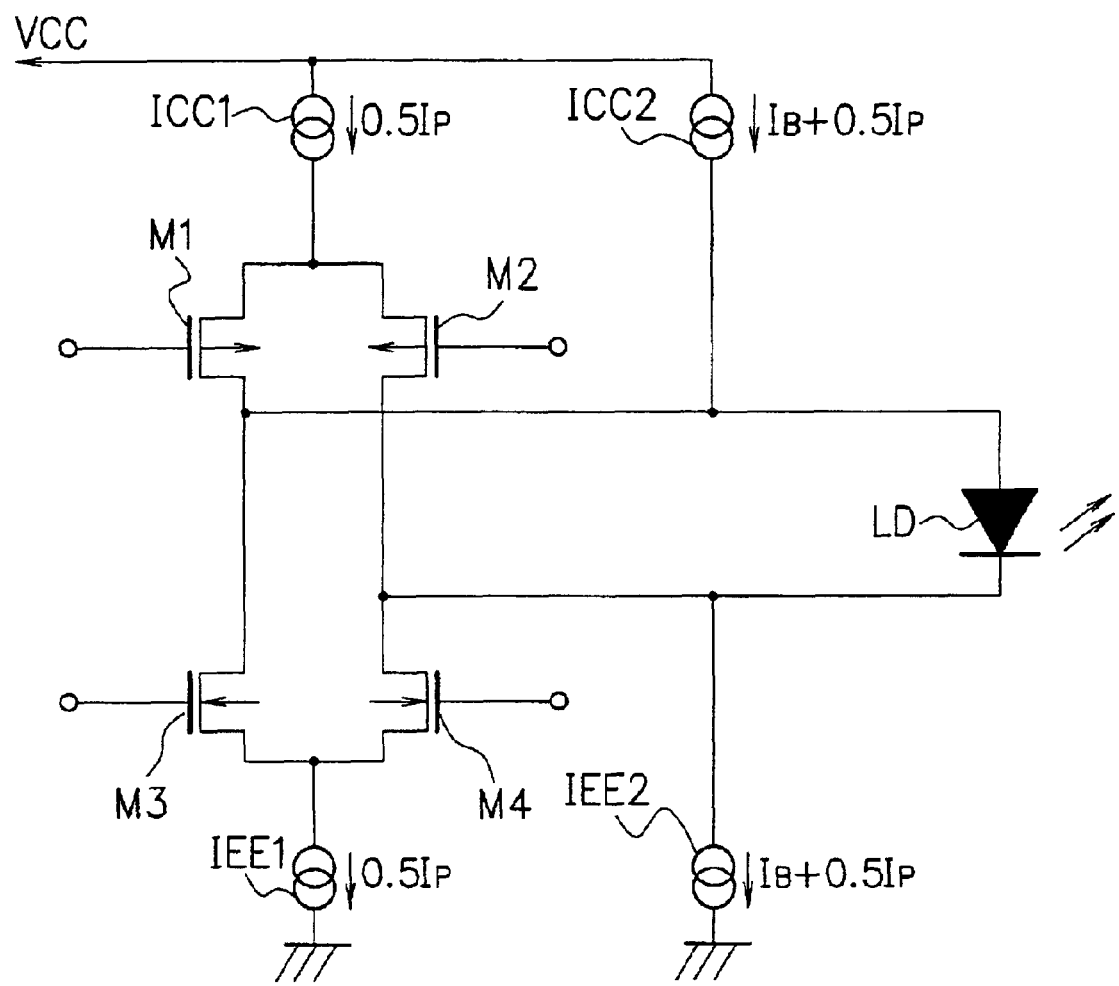
FIG. 4 is a circuit diagram showing a first embodiment of the present invention.

Referring to FIG. 4, there is shown a circuit diagram of an optical transmitting circuit according to an embodiment of the present invention. The circuit comprises P-channel MOSFETs M1 and M2, N-channel MOSFETs M3 and M4, constant current sources ICCI and IEE1 which set up current passing through when these transistors are in on-state, and constant current sources ICC2 and IEE2 which set up bias current of an LD. Giving more detailed explanation, between a positive power supply VCC and a negative power supply (here, earth potential), the constant current source ICC2, the LD, and the constant current source IEE2 are connected in series in this order. And also, between the positive power supply VCC and another negative power supply, the constant current source ICC1, the MOSFETs M1 and M3, and the constant current source IEE1 are connected in series in this order. Moreover, between the positive power supply VCC and the latter negative power supply, the constant current source ICCI, the MOSFETs M2 and M4, the constant current source IEE1 are also connected in series in this order.

A series connection point between the MOSFETs M1 and M3 is a positive phase output terminal, and connected to an anode electrode of the LD. And also, a series connection point between the MOSFETs M2 and M4 is negative phase output terminal, and connected to a cathode electrode of the laser diode LD.

The switching circuit which is composed of the P-channel MOSFETs M1 and M2, N-channel MOSFETs M3 and M4, and constant current sources ICC1 and IEE1 is publicly known as a drive circuit with metallic pair wires. Especially "LVDS (Low Voltage Differential Signaling)", in which a voltage level is optimized to connect a circuit section to a liquid crystal display device of a notebook-sized personal computer, is regulated by IEEE1596.3 and widely known.

It is assumed that gate length L and gate width W of each MOSFET M1, M2, M3, and M4 are set up so that a value of output resistance shows 25Ω when each of the MOSFETs is in on-state. The value is equal to characteristic impedance 25Ω of a transmission line which connects the switching circuit, which serves as an FET circuit device, to the LD.

A current value of each constant current source ICC1 and IEE1 is set to $0.5\ I_P$, and a current value of each constant current source ICC2 and IEE2 is set to $I_B+0.5\ I_P$. The LD is formed on a semi-insulating substrate. Both of the anode electrode and the cathode electrode are led out from the surface of the substrate.

In order to make the LD in an emission state, the MOSFETs M1 and M4 are turned on and the MOSFETs M2 and M3 are turned off by a drive control signal which is supplied to a gate of each FET. Then a first current path, in which current of the current value 0.5 $I_P$ might run in the direction of ICC1→M1→anode of LD→cathode of LD→M4→IEE1, is formed. In addition to the current, the current of $I_B$+0.5 $I_P$ runs into the anode of the LD from the constant current source ICC2, and the current of $I_B$+0.5 $I_P$ runs off from cathode of the LD to the constant current source IEE2. By this means, the current of the current value $I_B$+$I_P$ runs between the anode and the cathode of the LD.

In order to make the LD in a non-emission state, the MOSFETs M2 and M3 are turned on and the MOSFETs M1 and M4 are turned off by a drive control signal which is supplied to a gate of each FET. Then a second current path is formed, in which current might be thought of as running in either direction as below. The following is the possible current path.

First, in the second current path, current of the current value 0.5 $I_P$ might run in the direction of ICC1→M2→cathode of LD→anode of LD→M3→IEE1. In addition to the current, the current of $I_B$+0.5 $I_P$ might run from the constant current source ICC2 into the anode of the LD, and the current of $I_B$+0.5 $I_P$ might run off from the cathode of the LD to the constant current source IEE2. By this means, the current of the current value $I_B$ might run between the anode and the cathode of the LD.

Second, in the second current path, the current of the current value 0.5 $I_P$ might run in the direction of ICC1→M2→IEE2. In addition to the current, the current of 0.5 $I_P$ might run in the direction of ICC2→M3→IEE1 and the current $I_B$ might run in the direction of ICC2→anode of LD→cathode of LD→IEE2. By this means, the current of the current value $I_B$ might run between the anode and cathode of the LD. In other words, the current $I_B$+0.5 $I_P$ ran through ICC2 might be separated in two paths. One might run in the direction of ICC2→anode of LD→cathode of LD→IEE2, and the other might run in the direction of ICC2→M3→IEE1 as beforesaid.

Figure 2:
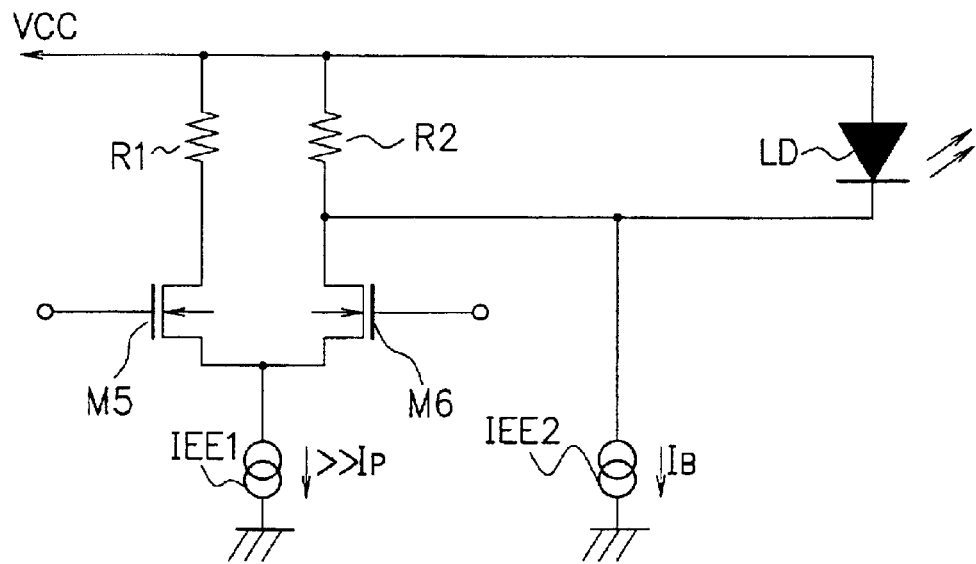
FIG. 2 is a diagram showing a first example of a conventional circuit.
Figure 3:
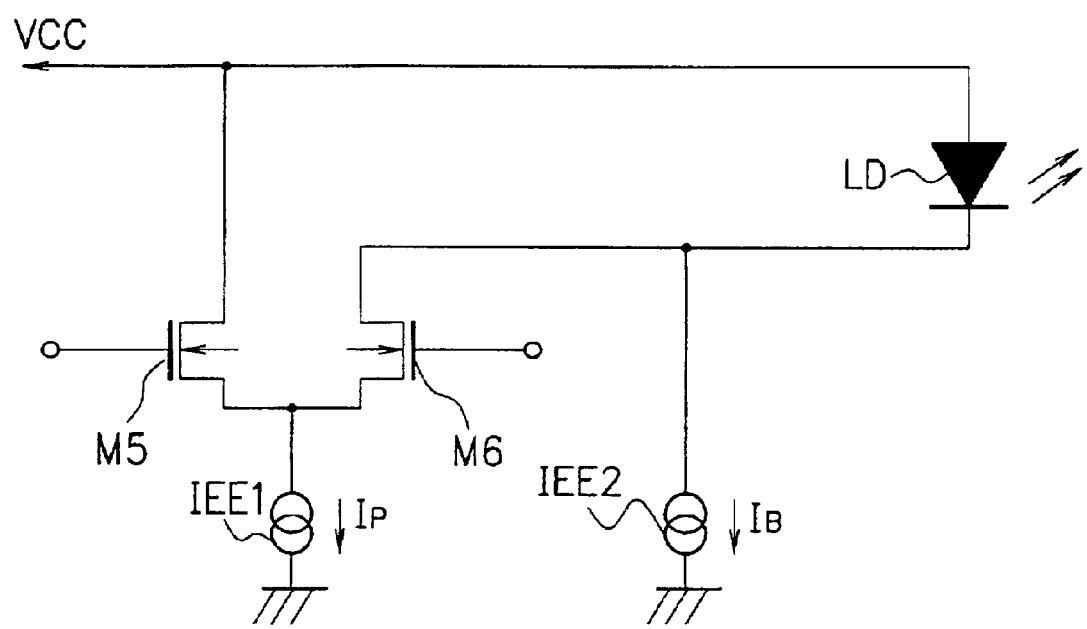
FIG. 3 is a diagram showing a second example of a conventional circuit.

In order to gain $I_P$=30 mA, the value of the constant current source IEE1 is 15 mA according to this embodiment, while it is 78 mA according to the example of the prior art in FIG. 2 as described hereinbefore. Therefore, the electric power consumption is reduced to equal to or less than ⅕ of that of the conventional circuit. Besides, switching current is reduced equal to or less than ⅕, so that crosstalk to a receiver which is disposed in the vicinity of a transmitting circuit in a duplex-type transceiver module(s) is reduced equal to or less than ⅕.

Next, there is shown a second embodiment of the present invention. FIG. 5 is a circuit diagram showing an example of the second embodiment of the present invention, in which the same reference numerals denote parts similar to those in FIG. 4. In FIG. 5, the circuit is composed of NPN bipolar transistors Q1, Q2, Q3, and Q4, a constant current source IEE1 which sets up current running when these transistors are turned on, and constant current sources ICC2 and IEE2 which set up bias current of an LD.

It is assumed that output emitter resistance of each bipolar transistor Q1 and Q2 in on-state is 25Ω as well as the case of FIG. 4. A current value of the constant current source IEE1 is set to 0.5 $I_P$, and a current value of each constant current source ICC2 and IEE2 is set to $I_B$+0.5 $I_P$. The LD is formed on a semi-insulating substrate. Both of the anode electrode and the cathode electrode are led out from the surface of the substrate.

In order to make the LD in an emission state, the transistors Q1 and Q4 are turned on and the transistors Q2 and Q3 are turned off. Then a first current path, in which current of the current value 0.5 $I_P$ might run in the direction of VCC→Q1→anode of LD→cathode of LD→Q4→IEE1, is formed. In addition to the current, the current of $I_B$+0.5 $I_P$ runs into the anode of the LD from the constant current source ICC2, and the current of $I_B$+10.5 $I_P$ runs off from the cathode of the LD to the constant current source IEE2. By this means, the current of the current value $I_B$+$I_P$ runs between the anode and the cathode of the LD.

In order to make the LD in a non-emission state, the transistors Q2 and Q3 are turned on and the transistors Q1 and Q4 are turned off. Then a second current path is formed, in which current might be thought of as running in either direction as below. The following is the possible current path.

First, in the second current path, current of the current value 0.5 $I_P$ might run in the direction of VCC→Q2→cathode of LD anode of LD→Q3→IEE1. In addition to the current, the current of $I_B$+0.5 $I_P$ might run from the constant current source ICC2 into the anode of the LD, and the current of $I_B$+0.5 $I_P$ might run off from the cathode of the LD to the constant current source IEE2. By this means, the current of the current value $I_B$ might run between the anode and the cathode of the LD.

Second, in the second current path, the current of the current value 0.5 $I_P$ might run in the direction of VCC→Q2→IEE2. In addition to the current, 0.5 $I_P$ might run in the direction of ICC2→Q3→IEE1 and the current $I_B$ might run in the direction of ICC2→anode of LD→cathode of LD→IEE2. By this means, the current of the current value $I_B$ might run between the anode and cathode of the LD. In other words, the current $I_B$+0.5 $I_P$ ran through ICC2 might be separated in two paths. One might run in the direction of ICC2→anode of LD→cathode of LD→IEE2, and the other might run in the direction of ICC2→Q3→IEE1 as beforesaid.

In order to gain $I_P$=30 mA, the current value of IEE1 is also 15 mA in this embodiment, while it is 78 mA according to the example of the prior art in FIG. 2 as described hereinbefore. Therefore, the electric power consumption is reduced to equal to or less than ⅕ of that of the conventional circuit. Besides, switching current is reduced to equal to or less than ⅕, so that crosstalk to a receiver which is disposed in the vicinity of a transmitting circuit in a duplex-type transceiver module(s) is reduced to equal to or less than ⅕.

In the first and the second embodiments described hereinbefore, MOSFETs, or bipolar transistors are employed for transistors, but it is also possible to employ other types of transistors. Besides, in the embodiments, a laser diode is employed for a emitting device, but it is definitely possible to employ other types of emitting devices, for example, a light emitting diode (LED), a combination of a direct emitting device and an optical modulator, and so forth.

As explained hereinbefore, according to the present invention, low electric power consumption in a high-speed transmitting circuit for optical fiber communications is realized. Besides, according to the present invention, in a duplex-type transceiver module(s) for optical fiber communications, it is realized that crosstalk from a high-speed transmitting circuit to a receiver is reduced. By these effects, it is possible to realize a high-speed and miniature optical transmitter and receiver module(s) such as 10 giga bit Ethernet and parallel optical links. Therefore an optical transmitting circuit according to the present invention may be practically useful.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An optical transmitting circuit comprising:
    an emitting device having each electrode of an anode and a cathode; and
    a switching means for supplying drive current to the emitting device, in which a positive phase output terminal is connected to the anode electrode and a negative phase output terminal is connected to the cathode electrode, wherein the switching means includes:
    a first current path for supplying constant current from the anode electrode to the cathode electrode in response to an emission drive signal which makes the emitting device in an emission state; and
    a second current path for supplying the constant current from the cathode electrode to the anode electrode in response to a non-emission drive signal which makes the emitting device in a non-emission state.

2. The optical transmitting circuit as claimed in claim 1, having duplex module structure in which an optical receiving circuit is paired with an optional transmitting circuit and equipped in the vicinity of the optical transmitting circuit.

3. An optical transmitting circuit comprising;
    an emitting device having each electrode of an anode and a cathode; and
    a switching means for supplying drive current to the emitting device, in which a positive phase output terminal is connected to the anode electrode and a negative phase output terminal is connected to the cathode electrode, wherein:
    the switching means includes a first current path for supplying constant current from the anode electrode to the cathode electrode in response to an emission drive signal which makes the emitting device in an emission state, and a second current path for supplying the constant current from the cathode electrode to the anode electrode in response to a non-emission drive signal which makes the emitting device in a non-emission state; and
    output impedance of the positive phase and the negative phase output terminals is set up to equal to characteristic impedance of a transmission line between the switching means and the emitting device.

4. The optical transmitting circuit as claimed in claim 3, having duplex module structure in which an optical receiving circuit is paired with an optional transmitting circuit and equipped in the vicinity of the optical transmitting circuit.

5. An optical transmitting circuit comprising;
    an emitting device having each electrode of an anode and a cathode;
    a switching means for supplying drive current to the emitting device, in which a positive phase output terminal is connected to the anode electrode and a negative phase output terminal is connected to the cathode electrode; and
    a bias means for supplying bias current to the emitting device, wherein:
    the switching means includes a first current path for supplying constant current from the anode electrode to the cathode electrode in response to an emission drive signal which makes the emitting device in an emission state, and a second current path for supplying the constant current from the cathode electrode to the anode electrode in response to a non-emission drive signal which makes the emitting device in a non-emission state; and
    the bias means includes a first constant current source connected to a node between a positive power supply and the positive phase output terminal, and a second constant current source connected to a node between a negative power supply and the negative phase output terminal.

6. The optical transmitting circuit as claimed in claim 5, having duplex module structure in which an optical receiving circuit is paired with an optional transmitting circuit and equipped in the vicinity of the optical transmitting circuit.

7. An optical transmitting circuit comprising;
    an emitting device having each electrode of an anode and a cathode;
    a switching means for supplying drive current to the emitting device, in which a positive phase output terminal is connected to the anode electrode and a negative phase output terminal is connected to the cathode electrode; and
    a bias means for supplying bias current to the emitting device, wherein:
    the switching means includes a first current path for supplying constant current from the anode electrode to the cathode electrode in response to an emission drive signal which makes the emitting device in an emission state, and a second current path for supplying the constant current from the cathode electrode to the anode electrode in response to a non-emission drive signal which makes the emitting device in a non-emission state;
    the bias means includes a first constant current source connected to a node between a positive power supply and the positive phase output terminal, and a second constant current source connected to a node between a negative power supply and the negative phase output terminal; and
    output impedance of the positive phase and the negative phase output terminals is set up to equal to characteristic impedance of a transmission line between the switching means and the emitting device.

8. The optical transmitting circuit as claimed in claim 7, having duplex module structure in which an optical receiving circuit is paired with an optional transmitting circuit and equipped in the vicinity of the optical transmitting circuit.

9. An optical transmitting circuit comprising;
    an emitting device having each electrode of an anode and a cathode;
    a bias means for supplying bias current to the emitting device, which includes a first constant current source connected to a node between a positive power supply and a positive phase output terminal, and a second constant current source connected to a node between a negative power supply and a negative phase output terminal; and
    a switching means for supplying drive current to the emitting device, in which the positive phase output terminal is connected to the anode electrode and the negative phase output terminal is connected to the cathode electrode, including:
    a third constant current source which is connected to the positive power supply side and produces constant current;

a fourth constant current source which is connected to the negative power supply side and produces the constant current;

a first current path for supplying the constant current from the anode electrode to the cathode electrode in response to an emission drive signal which makes the emitting device in an emission state, which has a first transistor of a first conductive type which is connected to a node between the third constant current source and the positive phase output terminal and on-controlled by the emission drive signal, and a second transistor of a second conductive type which is connected to a node between the fourth constant current source and the negative phase output terminal and on-controlled by the emission drive signal;

a second current path for supplying the constant current from the cathode electrode to the anode electrode in response to a non-emission drive signal which makes the emitting device in a non-emission state, which has a third transistor of the first conductive type which is connected to a node between the third constant current source and the negative phase output terminal and on-controlled by the non-emission drive signal, and a fourth transistor of the second conductive type which is connected to a node between the fourth constant current source and the positive phase output terminal and on-controlled by the non-emission drive signal.

10. The optical transmitting circuit as claimed in claim 9, wherein the first to the fourth transistors are bipolar transistors.

11. The optical transmitting circuit as claimed in claim 9, wherein the first to the fourth transistors are electric field effect transistors.

12. The optical transmitting circuit as claimed in claim 9, wherein the first to fourth transistors are electric field effect transistors, and each of the first conductive type transistors is P-channel, and each of the second conductive type transistor is N-channel.

13. The optical transmitting circuit as claimed in claim 9, wherein the first to fourth transistors are bipolar transistors, and each of the first conductive type transistors is PNP type, and each of the second conductive type transistors is NPN type.

14. The optical transmitting circuit as claimed in claim 9, having duplex module structure in which an optical receiving circuit is paired with an optional transmitting circuit and equipped in the vicinity of the optical transmitting circuit.

15. An optical transmitting circuit comprising;

an emitting device having each electrode of an anode and a cathode;

a bias means for supplying bias current to the emitting device, which includes a first constant current source connected to a node between a positive power supply and a positive phase output terminal, and a second constant current source connected to a node between a negative power supply and a negative phase output terminal; and a switching means for supplying drive current to the emitting device, in which the positive phase output terminal is connected to the anode electrode and the negative phase output terminal is connected to the cathode electrode, including:

a third constant current source which is connected to the negative power supply side and produces constant current;

a first current path for supplying the constant current from the anode electrode to the cathode electrode in response to an emission drive signal which makes the emitting device in an emission state, which has a first transistor which is connected to a node between the positive power supply side and the positive phase output terminal and on-controlled by the emission drive signal, and a second transistor which is connected to a node between the third constant current source and the negative phase output terminal and on-controlled by the emission drive signal; and a second current path for supplying the constant current from the cathode electrode to the anode electrode in response to a non-emission drive signal which makes the emitting device in a non-emission state, which has a third transistor which is connected to a node between the positive power supply and the negative phase output terminal and on-controlled by the non-emission drive signal, and a fourth transistor which is connected between the third constant transistor and the positive phase output terminal and on-controlled by the non-emission drive signal.

16. The optical transmitting circuit as claimed in claim 15, wherein the first to the fourth transistors are bipolar transistors.

17. The optical transmitting circuit as claimed in claim 15, wherein the first to the fourth transistors are electric field effect transistors.

18. The optical transmitting circuit as claimed in claim 15, wherein the first to fourth transistors are electric field effect transistors, and each of the first conductive type transistors is P-channel, and each of the second conductive type transistor is N-channel.

19. The optical transmitting circuit as claimed in claim 15, wherein the first to fourth transistors are bipolar transistors, and each of the first conductive type transistors is PNP type, and each of the second conductive type transistors is NPN type.

20. The optical transmitting circuit as claimed in claim 15, having duplex module structure in which an optical receiving circuit is paired with an optional transmitting circuit and equipped in the vicinity of the optical transmitting circuit.

* * * * *